United States Patent
Huang et al.

(10) Patent No.: US 9,384,996 B2
(45) Date of Patent: Jul. 5, 2016

(54) METHOD FOR MANUFACTURING SEMICONDUCTOR DEVICE AND DEVICE MANUFACTURED BY THE SAME

(71) Applicant: UNITED MICROELECTRONICS CORP., Hsinchu (TW)

(72) Inventors: Po-Cheng Huang, Kaohsiung (TW); Yu-Ting Li, Chiayi (TW); Jen-Chieh Lin, Kaohsiung (TW); Kun-Ju Li, Tainan (TW); Chang-Hung Kung, Kaohsiung (TW); Yue-Han Wu, Taitung County (TW); Chih-Chien Liu, Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/272,672

(22) Filed: May 8, 2014

(65) Prior Publication Data
US 2015/0325574 A1 Nov. 12, 2015

(51) Int. Cl.
*H01L 21/3105* (2006.01)
*H01L 27/088* (2006.01)
*H01L 29/66* (2006.01)
*H01L 21/8234* (2006.01)

(52) U.S. Cl.
CPC ...... *H01L 21/3105* (2013.01); *H01L 21/31055* (2013.01); *H01L 21/823437* (2013.01); *H01L 21/823462* (2013.01); *H01L 27/0886* (2013.01); *H01L 29/66* (2013.01); *H01L 29/6681* (2013.01); *H01L 21/823431* (2013.01); *H01L 27/088* (2013.01)

(58) Field of Classification Search
None
See application file for complete search history.

(56) References Cited

U.S. PATENT DOCUMENTS 7,846,790 B2 * 12/2010 Kang .............. H01L 21/823462
257/392
2002/0034848 A1 3/2002 Park

* cited by examiner

*Primary Examiner* — Matthew Reames
*Assistant Examiner* — Steven B Gauthier
(74) *Attorney, Agent, or Firm* — WPAT, PC; Justin King

(57) ABSTRACT

A method for manufacturing a semiconductor device and a device manufactured by the same are provided. According to the embodiment, a substrate having at least a first area with a plurality of first gates and a second area with a plurality of second gates is provided, wherein the adjacent first gates and the adjacent second gates separated by an insulation, and a top surface of the insulation has a plurality of recesses. Then, a capping layer is formed over the first gate, the second gates and the insulation, and filling the recesses. The capping layer is removed until reaching the top surface of the insulation, thereby forming the insulating depositions filling up the recesses, wherein the upper surfaces of the insulating depositions are substantially aligned with the top surface of the insulation.

21 Claims, 4 Drawing Sheets

METHOD FOR MANUFACTURING SEMICONDUCTOR DEVICE AND DEVICE MANUFACTURED BY THE SAME

BACKGROUND

1. Technical Field

The disclosure relates in general to a method for manufacturing a semiconductor device and a device manufactured by the same, and more particularly to the method for manufacturing a semiconductor device having sufficient gate height, thereby improving the electrical characteristics of the semiconductor device.

2. Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical properties, would be one of the important issues of the device for the manufacturers. Generally, a semiconductor device with good electrical performance requires the gates with excellent properties such as complete profiles and sufficient height. The current gate forming process generally suffers from the spacer loss and consequently gate height loss, which having undesirable effect on the electrical characteristics of the device.

Accordingly, it is desired to develop a method for forming a gate with sufficient height for the manufacturing process, and also solve the problem of gate height loss.

SUMMARY

The disclosure is directed to a method for manufacturing a semiconductor device and device manufactured by the same, which insulating deposition is adopted for acquiring sufficient gate height, thereby improving the electrical characteristics of the semiconductor device.

According to the disclosure, a method for manufacturing a semiconductor device is provided. A substrate having at least a first area with a plurality of first gates and a second area with a plurality of second gates is provided, wherein the adjacent first gates and the adjacent second gates separated by an insulation, and a top surface of the insulation has a plurality of recesses. Then, a capping layer is formed over the first gate, the second gates and the insulation, and filling the recesses. The capping layer is removed until reaching the top surface of the insulation.

According to the disclosure, a semiconductor device is provided, comprising a substrate having at least a first area with a plurality of first gates and a second area with a plurality of second gates, the adjacent first gates and the adjacent second gates separated by an insulation, wherein a top surface of the insulation has a plurality of recesses. The semiconductor device also comprises a plurality of insulating depositions filling up the recesses, wherein the upper surfaces of the insulating depositions are substantially aligned with the top surface of the insulation.

DETAILED DESCRIPTION

Figure 1A:
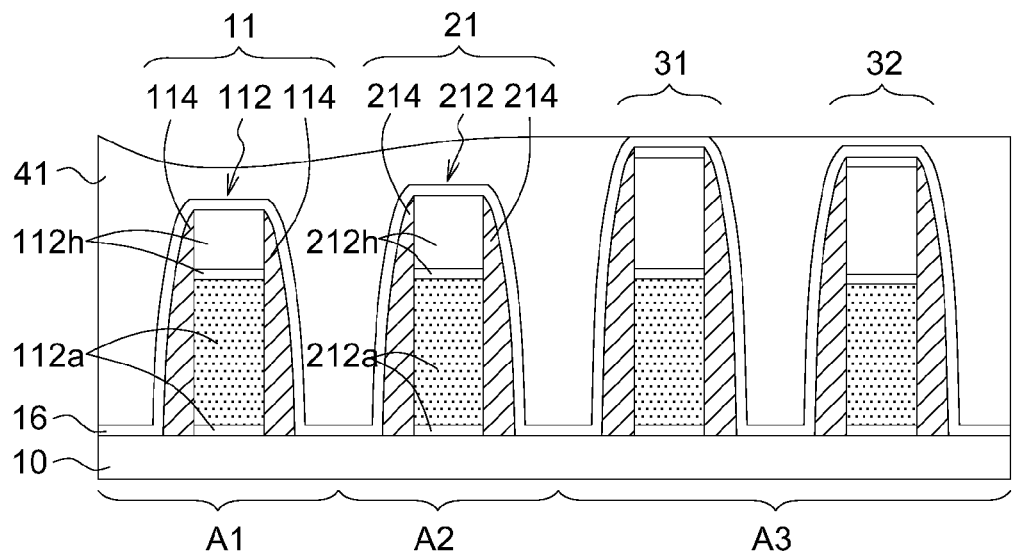
FIG. 1A~FIG. 1F illustrate a method for manufacturing a semiconductor device according to one embodiment of the present disclosure.

In the embodiment of the present disclosure, a method for manufacturing a semiconductor device is provided. According to the embodiment, the semiconductor device as manufactured has sufficient gate heights and complete profiles of the gates, thereby possessing great electrical properties. The embodied method of the present disclosure solves the problem of gate height loss typically occurred in the conventional process for manufacturing the semiconductor device.

Embodiments are provided hereinafter with reference to the accompanying drawings for describing the related configurations and procedures, but the present disclosure is not limited thereto. It is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

In the embodiment, a capping layer is deposited followed by a planarization step to form the insulating depositions filling up the recesses (occurred due to the preceded steps), so that the upper surfaces of the insulating depositions are aligned with the top surfaces of the gates. Accordingly, the semiconductor device manufactured by the embodied method possesses sufficient gate heights and complete profiles of the gates. The method for manufacturing the semiconductor device is applicable to different types of the semiconductor devices, such as semiconductor devices with high K metal gates. The methods could be slightly different, and modified and changed depending on the types and actual needs of the practical applications. A method for manufacturing the semiconductor device with high K metal gate in the gate last approach (HK-last) is illustrated for describing the embodiment as one of the applications, but it is noted that the present disclosure is not limited thereto.

FIG. 1A~FIG. 1F illustrate a method for manufacturing a semiconductor device according to one embodiment of the present disclosure. In the embodiment, a substrate 10 having at least a first area A1 and a second area A2 is provided. The substrate 10 may further comprise a third area such as a bump area A3 as exemplified in the drawings. According to one embodiment, the first area A1 and the second area A2 can be a NMOS area and a PMOS area, respectively. In one embodiment, the bump area A3 may comprise at least a first bump (such as a logic bump) 31 and a second bump (such as a static random-access memory (SRAM) bump) 32. The manufacturing method of the embodiment can be widely applied to different semiconductor devices. In one of the applications, the first area A1 may comprise a plurality of first fin field electric transistors (FinFETs), and the second area A2 may comprise a plurality of second FinFETs.

As shown in FIG. 1A, the first area A1 and the second area A2 of the substrate 10 comprise at least a first dummy structure 11 and a second dummy structure 21, respectively. The first dummy structure 11 comprises a first dummy gate structure 112 on the substrate 10, and the spacers 114 formed at two sides of the first dummy gate structure 112. Similarly, the second dummy structure 21 comprises a second dummy gate structure 212 on the substrate 10, and the spacers 214 formed at two sides of the second dummy gate structure 212.

In one embodiment, the first dummy gate structure 112 comprises a first dummy layer 112a formed on the substrate 10 and a first hard mask layer 112h formed on the first dummy layer 112a. The first dummy layer 112a may include a polysilicon layer or an amorphous silicon layer formed on a thin oxide layer. In one embodiment, the first hard mask layer 112h could include (but not limited to) a nitrite layer, an oxide layer, or both; for example, the first hard mask layer 112h include a silicon nitrile (SIN) layer formed on the amorphous silicon layer, and an oxide layer formed on the SIN layer. The spacers 114 could be multi-layer, or single layer as depicted in FIG. 1A. Similarly, the second dummy gate structure 212 comprises a second dummy layer 212a (ex: a polysilicon layer or an amorphous silicon layer formed on a thin oxide layer) formed on the substrate 10 and a second hard mask layer 212h (a SIN layer formed on the amorphous silicon layer, and an oxide layer formed on the SIN layer) formed on the second dummy layer 212a. Similarly, each of the first bump (such as a logic bump) 31 and the second bump (such as a SRAM bump) 32 in the bump area A3 has the similar structure as the first dummy structure 11 and the second dummy structure 21.

In one of the examples, the thin oxide layers on the substrate in the first and second dummy structures 11/21 and the first and second bumps 31/32 are about 38 Å in thickness. The amorphous silicon (a-Si) layers formed on the thin oxide layer in the first and second dummy structures 11/21 and the first and second bumps 31/32 are about 1100 Å in thickness. Accordingly, the first dummy layer 112a and the second dummy layer 212a (and the dummy layers of the first and second bumps 31/32) have the same height. However, the hard mask layers of the first and second dummy structures 11/21 and the first and second bumps 31/32 could be different, due to the different thickness of the oxide layers in the application. For example, the SiN layers on the a-Si layer are about 100 Å in thickness in the first and second dummy structures 11/21 and the first and second bumps 31/32. In the first area A1, the oxide layer of the first hard mask layer 112h is about 400 Å in thickness; in the second area A2, the oxide layer of the second hard mask layer 212h is about 450 Å in thickness; in the third area A3, the oxide layers of the first bump 31 and the second bump 32 are about 900 Å and 800 Å in thickness. Noted that those values are demonstrated for exemplifying structural scales of one applicable application, not for limiting the scope of the claimed invention.

Also, the semiconductor device further comprises a contact etch stop layer (CESL) 16 formed on the substrate 10 for covering the substrate 10, the first dummy structure 11 and the second dummy structure 21, and also the first bump 31 and the second bump 32 in the bump area A3. A flowable chemical vapor deposition (FCVD) process is adopted in one of the applications with the embodied method. A flowable dielectric layer 41 is deposited over the device by CVD, and the flowable dielectric layer 41 is polished by CMP to stop the flowable dielectric layer 41 on the bump (such as the first bump 31), as shown in FIG. 1A.

Figure 1B:
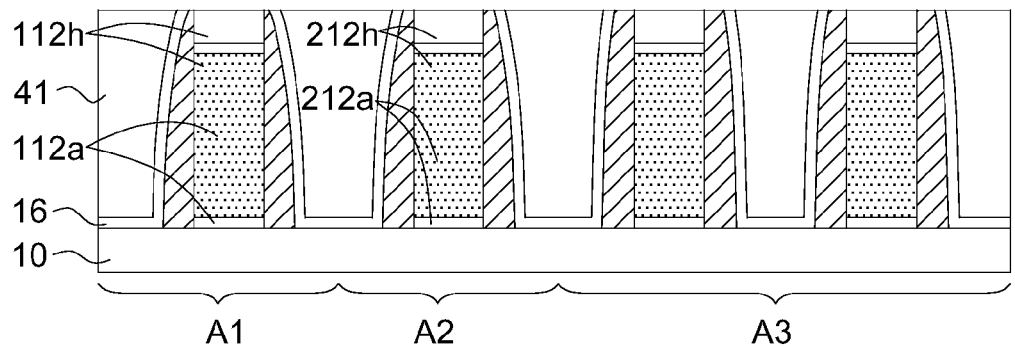

As shown in FIG. 1B, the semiconductor device is subjected to a non-selective etching, to remove top portions of the first and second dummy structures 11/21 and the first and second bumps 31/32 and create a planar surface. In FIG. 1B, the top surface of the CESL 16, parts of the spacers 114, 214, and parts of the oxide layers of the first hard mask layers 112h, the second hard mask layers 212h, the first bump 31 and the second bump 32 are removed. In one example, the remained oxide layers are about 200 Å in thickness.

Figure 1C:
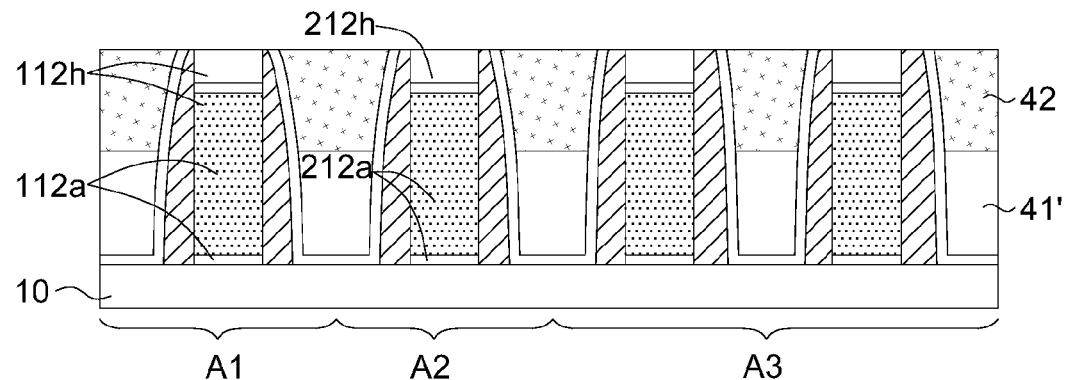

As shown in FIG. 1C, part of the flowable dielectric layer 41 is replaced by a HDP (high density plasma) dielectric layer 42 (i.e. a dielectric layer deposited by high density plasma CVD). In one embodiment, the flowable dielectric layer 41 can be partially removed by SiCoNi etch back, followed by forming a dielectric layer 42 deposited by HDP CVD, and polished by CMP.

Figure 1D:
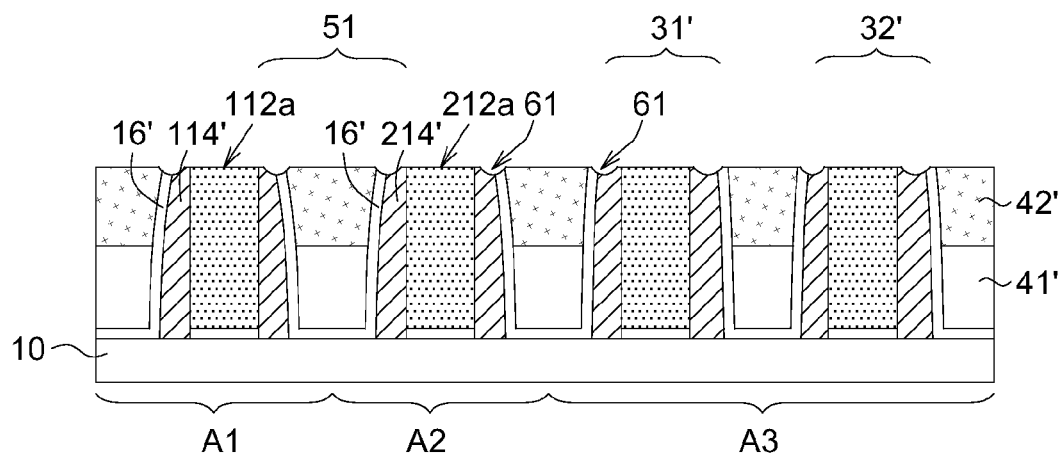

As shown in FIG. 1D, the device is then polished to remove the hard masks (ex: the remained oxide layers and SiN layers in FIG. 1C) of the first dummy structure 11, the second dummy structure 21, the first second bump 31 and the second bump 32. In FIG. 1D, the first dummy layer 112a (ex: about 1100 Å of the a-Si layer and about 38 Å of the thin oxide layer) and the second dummy layer 212a (and the dummy layers of the first and second bumps 31/32) substantially have the same height. In one of the applications, the polysilicon or amorphous silicon of the dummy layer (as a dummy gate) would be replaced by metal to form metal gate in the subsequent process. For example, if a high K last process is adopted in the subsequent process, a high-k dielectric layer is deposited in a trench which is formed by removing the dummy gate, followed by filling the metal in the trench to form metal gate. Accordingly, spacer profile, including shape and height, has considerable effect on the gate. Spacer loss may cause gate (ex: metal gate) height loss and incomplete profile of gate in the subsequent process.

Structurally, the spacers (ex: 114' and 214'), the CESL layer 16' and the patterned ILD (inter-layered dielectric, i.e. the patterned dielectric layer 42' and the flowable dielectric layer 41') as depicted in FIG. 1D can be treated as an insulation 51 as a whole, and the insulation 51 is positioned for separating the gate (the first gate; i.e., the first dummy layer 112a) of the first dummy structure 11', the gate (ex: the second gate; i.e., the second dummy layer 212a) of the second dummy structure 21', and the gates of the first second bump 31' and the second bump 32'.

In one embodiment, the spacers 114/114' and 214/214' and the contact etch stop layer 16/16' can be made of the same material (or different materials), while the material of the hard mask layer is different from that of the spacers 114/114' and 214/214' and the contact etch stop layer 16/16'. In one embodiment, the spacers and the contact etch stop layer are made of SICN and formed by atomic layer deposition (ALD). In one embodiment, the HDP dielectric layer is (but not limited to) made of oxide.

However, structural defect in the form of recesses 61 generally occurred at the top surface of the insulation 51 as depicted in FIG. 1D. In one embodiment, the recesses 61 positioned at the top surface of the insulation 51 are correspondingly across the tops of the spacers 114' and 214' and the contact etch stop layer 16'. The recesses 61 at the top surface of the insulation 51 would cause the problem of gate height loss and incomplete gate profile, which leads to the failure of device.

Figure 1E:
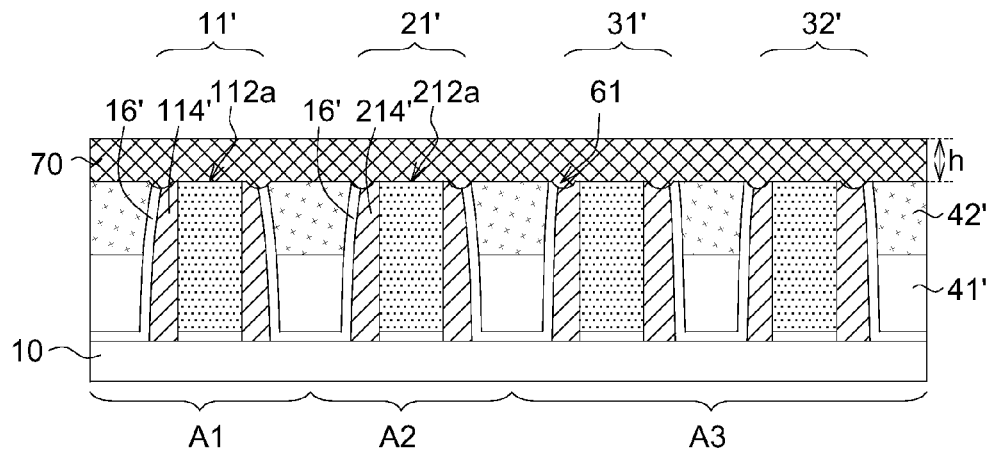
Figure 1F:
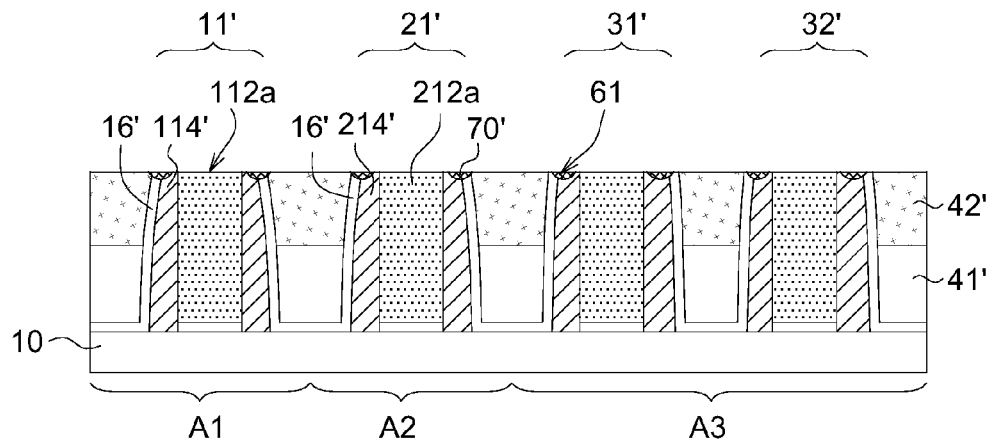

According to the embodiment, a capping layer 70 is formed over the insulation 51 and the gate (the first gate; i.e., the first dummy layer 112a) of the first dummy structure 11', the gate (ex: the second gate; i.e., the second dummy layer 212a) of the second dummy structure 21', and the gates of the first second bump 31' and the second bump 32', as shown in FIG. 1E. The recesses 61 are filled with material of the capping layer 70. Afterward, the capping layer 70 is removed, such as by chemical mechanical polishing (CMP), until reaching the top surface of the insulation 51, thereby forming the insulation depositions 70', as shown in FIG. 1F.

In one embodiment, a thickness h of the capping layer 70 is about 1.5~2.5 times than a depth d of the recesses 61. In one embodiment, a thickness h of the capping layer is about 250 Å. In one embodiment, the capping layer 70 comprises oxide, silicon nitride, or silicon carbide nitride (SiCN), and could be deposited by ALD deposition. The spacers 114/214 and the CESL 16 can be made by the same material or different materials. In one embodiment, the capping layer 70 and at least one of the spacers 114/214 and the CESL 16 comprise the same material. Alternatively, the capping layer 70 and at least one of the spacers 114/214 and the CESL 16 may comprise different materials.

Figure 2A:
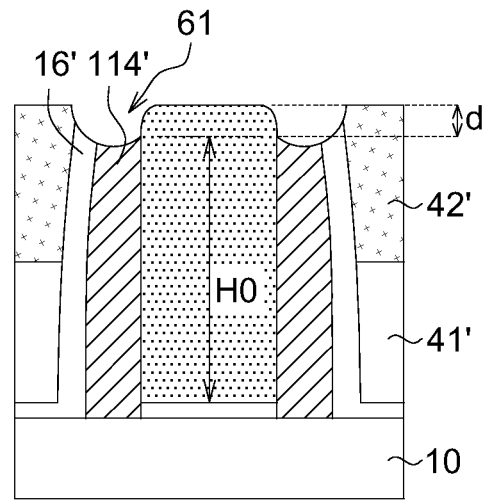
FIG. 2A is an enlarged structure showing the gate and the insulation of the first dummy structure of FIG. 1D.
Figure 2B:
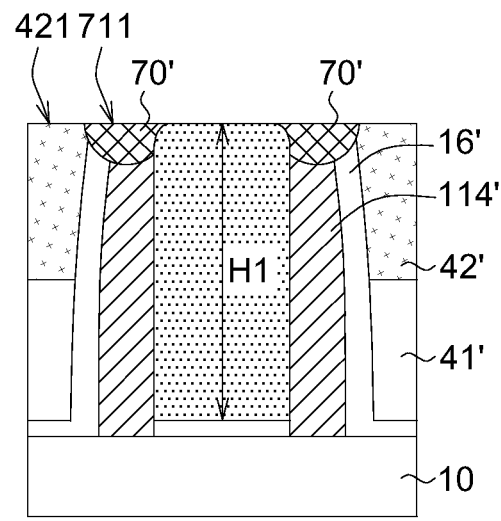
FIG. 2B is an enlarged structure showing the gate and the insulation of the first dummy structure of FIG. 1F.

Please refer to FIG. 2A and FIG. 2B. FIG. 2A is an enlarged structure showing the gate (the first gate; i.e., the first dummy layer 112a) and the insulation of the first dummy structure of FIG. 1D. FIG. 2B is an enlarged structure showing the gate and the insulation of the first dummy structure of FIG. 1F. In one embodiment, the recesses 61 positioned at the top surface of the insulation 51 are correspondingly across the tops of the spacers 114' and the CESL 16', as shown In FIG. 2A.

It is noted that structures of FIG. 2A and FIG. 2B show the gate height H0 without forming the insulation depositions 70' and the gate height H1 after forming the insulation depositions 70', wherein H0<H1 due to the spacer loss. According to the embodiment, the insulating depositions 70' fill up the recesses 61, and the upper surfaces 711 of the insulating depositions 70' are substantially aligned with a top surface of the insulation 51, such as aligned with the top surface 421 of the dielectric layer 42' (ex: HDP dielectric layer). After forming the insulation depositions 70, the gate with sufficient gate height (ex: H1) can be obtained. In one embodiment, the spacers and the insulating depositions 70' would contact the lateral sides of the first gate of the first dummy structure 11' in the first area A1, or the lateral sides of the second gate of the second dummy structure 21' in the second area A2.

Although FIG. 2B depicts the structure of insulation depositions 70', the first gate (i.e., the first dummy layer 112a) and the insulation of the first dummy structure for illustration, the second gate (i.e., the second dummy layer 212a) and the insulation of the second dummy structure with insulation depositions would be configured in the similar way for acquiring the sufficient gate height.

In the present disclosure, a method for manufacturing a semiconductor device is provided to effectively solve the problem of gate height loss. According to the embodiment, the semiconductor device manufactured by the embodied method consequently possesses sufficient gate heights and complete profiles of the gates, thereby obtaining good electrical characteristics of the embodied semiconductor device in the application. Additionally, the manufacturing method of the embodiment simplifies the manufacturing process which is able to solve the issue of insufficient gate height, so as to increase the yield of production and control the production cost.

Other embodiments with different configurations of gates are also applicable, which could be varied depending on the actual needs of the applications. It is, of course, noted that the configurations of FIGS. 1A-1F, and FIG. 2A and FIG. 2B are depicted only for demonstration, not for limitation. It is known by people skilled in the art that the shapes or positional relationship of the constituting elements could be adjusted according to the structural requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
providing a substrate having at least a first area with a plurality of first gates and a second area with a plurality of second gates, the adjacent first gates and the adjacent second gates separated by an insulation, wherein a top surface of the insulation has a plurality of recesses, and the insulation comprises a plurality of spacers formed at sidewalls of each of the first and second gates, and a contact etch stop layer (CESL) formed at outsides of the spacers;
forming a capping layer over the first gates, the second gates and the insulation, and filling the recesses; and
removing the capping layer until reaching the top surface of the insulation, so as to form a plurality of insulating depositions to fill up the recesses, wherein upper surfaces of the insulating depositions are positioned above and spaced apart from a top surface of the CESL and top surfaces of the spacers, the upper surfaces of the insulating depositions are substantially aligned with the top surface of the insulation, and the upper surfaces of the insulating depositions are parallel to top surfaces of the plurality of first gate and the plurality of second gates.

2. The method according to claim 1, wherein a thickness of the capping layer is about 1.5~2.5 times than a depth of the recesses.

3. The method according to claim 1, wherein a thickness of the capping layer is about 250 Å.

4. The method according to claim 1, wherein the capping layer comprises oxide, silicon nitride, or silicon carbide nitride (SiCN).

5. The method according to claim 1, wherein the insulation comprises:
a patterned ILD, formed in a space between adjacent portions of the CESL.

6. The method according to claim 5, wherein the recesses positioned at the top surface of the insulation are correspondingly across tops of the spacers and the CESL.

7. The method according to claim 5, wherein the capping layer and the CESL comprise the same material.

8. The method according to claim 5, wherein the patterned ILD is a single layer or a combination of multi-layers.

9. The method according to claim 1, wherein the capping layer is removed by chemical mechanical polishing (CMP).

10. The method according to claim 1, wherein the first gates and the second gates are respectively first silicon-containing gates and second silicon-containing gates, the method further comprises:
replacing the first silicon-containing gates and the second silicon-containing gates by metal to form plural first metal gates and second metal gates.

11. The method according to claim 10, further comprising:
removing silicon portions of the first silicon-containing gates and the second silicon-containing gates to form plural first trenches and plural second trenches;
forming a high-k dielectric layer in the first trenches and the second trenches; and
forming the metal on the high-k dielectric layer at the first trenches and the second trenches.

12. The method according to claim 1, wherein the first area comprises a plurality of first fin field electric transistors (FinFETs), and the second area comprises a plurality of second FinFETs.

13. A semiconductor device, comprising:
a substrate having at least a first area with a plurality of first gates and a second area with a plurality of second gates, the adjacent first gates and the adjacent second gates separated by an insulation, wherein a top surface of the insulation has a plurality of recesses, and the insulation comprises a plurality of spacers formed at sidewalls of each of the first and second gates, and a contact etch stop layer (CESL) formed at outsides of the spacers; and
a plurality of insulating depositions filling up the recesses, and upper surfaces of the insulating depositions being positioned above and spaced apart from a top surface of the CESL and top surfaces of the spacers,
wherein the upper surfaces of the insulating depositions are substantially aligned with the top surface of the insulation, and the upper surfaces of the insulating depositions are parallel to top surfaces of the plurality of first gate and the plurality of second gates.

14. The semiconductor device according to claim 13, wherein the insulating depositions comprise oxide, silicon nitride, or silicon carbide nitride (SiCN).

15. The semiconductor device according to claim 13, wherein the insulation comprises:
a patterned ILD, formed in a space between adjacent portions of the CESL.

16. The semiconductor device according to claim 15, wherein the insulating depositions in the recesses are positioned correspondingly across tops of the spacers and the CESL.

17. The semiconductor device according to claim 15, wherein the insulating depositions and the CESL comprise the same material.

18. The semiconductor device according to claim 15, wherein the patterned ILD is a single layer or a combination of multi-layers.

19. The semiconductor device according to claim 15, wherein the spacers and the insulating depositions contact lateral sides of the plurality of first gates or the plurality of second gates.

20. The semiconductor device according to claim 13, wherein the first area comprises a plurality of first fin field electric transistors (FinFETs), and the second area comprises a plurality of second FinFETs.

21. The semiconductor device according to claim 13, wherein the plurality of spacers and the contact etch stop layer are made of the same material.

* * * * *